United States Patent
Yamashita et al.

(10) Patent No.: US 6,724,237 B2
(45) Date of Patent: Apr. 20, 2004

(54) SEMICONDUCTOR INTEGRATED CIRCUIT FOR MULTI-CHIP PACKAGE WITH MEANS TO OPTIMIZE INTERNAL DRIVE CAPACITY

(75) Inventors: Takekazu Yamashita, Nagasaki (JP); Makoto Hatakenaka, Tokyo (JP); Manabu Miura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/212,842

(22) Filed: Aug. 7, 2002

(65) Prior Publication Data

US 2003/0057775 A1 Mar. 27, 2003

(30) Foreign Application Priority Data

Sep. 26, 2001 (JP) .......................... 2001-294539

(51) Int. Cl.⁷ .............................. G01R 31/27; G05F 1/00
(52) U.S. Cl. ....................................... 327/518; 324/765
(58) Field of Search ................ 324/765; 327/518–521; 257/685, 686, 723–725

(56) References Cited

U.S. PATENT DOCUMENTS 5,900,770 A * 5/1999 Sabin .......................... 327/519

FOREIGN PATENT DOCUMENTS

| JP | 5-75427 | 3/1993 |
| JP | 9-270698 | 10/1997 |
| JP | 10-209848 | 8/1998 |

* cited by examiner

*Primary Examiner*—Evan Pert
(74) *Attorney, Agent, or Firm*—Burns, Doane, Swecker & Mathis, LLP (57) ABSTRACT

A semiconductor integrated circuit can variably set the driving power of all or part of internal input/output terminals and internal output terminals used within a multi-chip package. It can increase the driving power at an individual wafer test before packaging to sufficiently drive a load connected between a tester and the internal input/output terminals and internal output terminals, and can reduce the driving power after packaging. It can prevent noise and power consumption from being increased.

12 Claims, 9 Drawing Sheets

SEMICONDUCTOR INTEGRATED CIRCUIT FOR MULTI-CHIP PACKAGE WITH MEANS TO OPTIMIZE INTERNAL DRIVE CAPACITY

BACKGROUND OF THE INVENTION

1. Field of the Invention

The present invention relates to a semiconductor integrated circuit used for a multi-chip package and a multi-chip package including a plurality of semiconductor integrated circuits.

2. Description of Related Art

Figure 12:
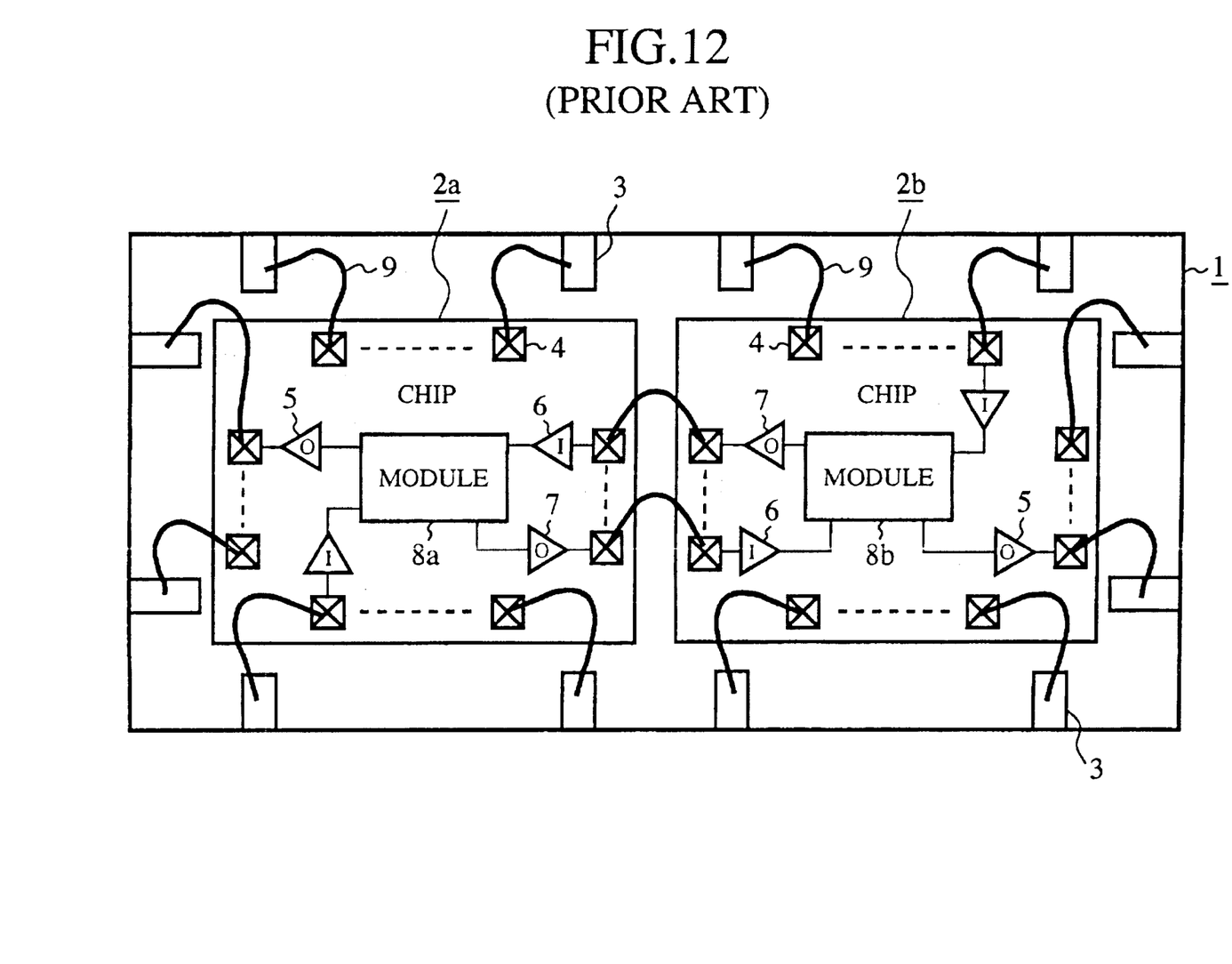
FIG. 12 is a diagram showing a configuration of semiconductor integrated circuits constituting a conventional multi-chip package.

FIG. 12 is a diagram showing a configuration of semiconductor integrated circuits used for a conventional multi-chip package. In this figure, the reference numeral 1 designates a multi-chip package (called "MCP" from now on) for packaging a plurality of chips; and reference numerals 2a and 2b each designate a chip (semiconductor integrated circuit).

In the MCP 1, each reference numeral 3 designates an MCP external terminal.

In the chips 2a and 2b, each reference numeral 4 designates a pad, 5 designates an external output driver for outputting an internal signal to the outside of the MCP 1; 6 designates an internal input driver for inputting a signal from another chip within the MCP 1; 7 designates an internal output driver for outputting an internal signal to another chip within the MCP 1; reference numerals 8a and 8b each designate a module; and each reference numeral 9 designates a wire for connecting one of the MCP external terminals 3 with one of the pads 4.

Figure 13:
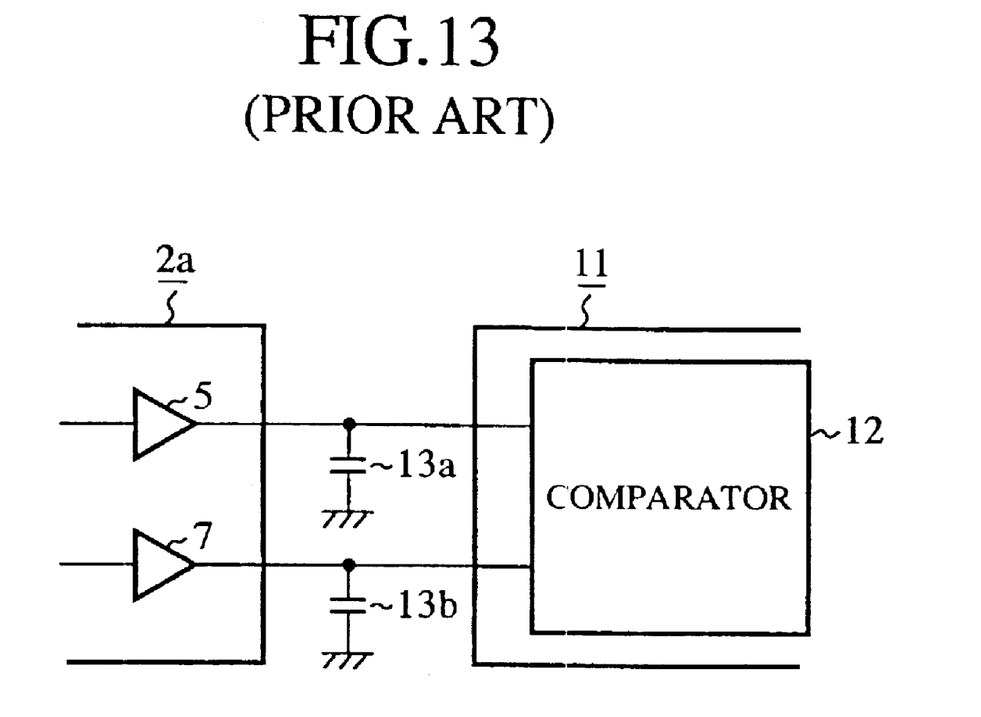
FIG. 13 is a block diagram showing a configuration for an individual wafer test of a conventional chip.

FIG. 13 is a block diagram showing a configuration for an individual wafer test of a conventional chip. In this figure, the reference numeral 2a designates a chip and 11 designates a tester.

In the chip 2a, the reference numeral 5 designates an external output driver and 7 designates an internal output driver, which correspond to the components designated by the same reference numerals in FIG. 12. In the tester 11, the reference numeral 12 designates a comparator. Reference numerals 13a and 13b each designate a load capacitance of the tester 11.

In FIG. 12, each couple of the pad 4 and external output driver 5 constitutes an external output terminal, each couple of the pad 4 and internal input driver 6 constitutes an internal input terminal, and each couple of the pad 4 and internal output driver 7 constitutes an internal output terminal. In addition, although not shown in FIG. 12, there is an external input/output driver for inputting a signal from the outside of the MCP 1 and for outputting an internal signal to the outside of the MCP 1. A couple of the pad and external input/output driver constitutes an external input/output terminal. Furthermore, there is an internal input/output driver for inputting a signal from another chip within the MCP 1 and for outputting an internal signal to another chip within the MCP 1. A couple of the pad and internal input/output driver constitutes an internal input/output terminal.

Next, the operation of the conventional device will be described.

The input/output terminals and output terminals of the chips 2a and 2b in the conventional MCP 1 have considerable sizes, and are divided into two types: terminals used as an external input/output terminals or external output terminals after packaging; and terminals used as an internal input/output terminals and internal output terminals after packaging.

As for the internal input/output terminals and internal output terminals, their drivers can be made smaller than the drivers of the external input/output terminals and external output terminals considering the usage after packaging.

However, for the individual wafer test as shown in FIG. 13 which is carried out before packaging, it is necessary for the drivers of the external input/output terminals and external output terminals and the drivers of the internal input/output terminals and internal output terminals to have a size needed for driving the load capacitances 13a and 13b of the tester 11, which are connected only during the test.

Therefore, although the size of the drivers of the internal input/output terminals and internal output terminals may be smaller than that of the drivers of the external input/output terminals and external output terminals after packaging, they must have about the same size for the individual wafer test before packaging.

With the foregoing configuration, the conventional semiconductor integrated circuit has a problem in that it is inevitable to increase the driver size of the internal input/output terminals and internal output terminals to drive the load capacitances 13a and 13b of the tester 11 before packaging. In addition, the improper driver size after packaging offers a problem of causing noise or increasing power consumption.

SUMMARY OF THE INVENTION

The present invention is implemented to solve the foregoing problems. It is therefore an object of the present invention to provide a semiconductor integrated circuit and multi-chip package capable of preventing noise and power consumption from being increased by optimizing the drive capacity after packaging.

According to a first aspect of the present invention, there is provided a semiconductor integrated circuit including driving power variably setting means for variably setting driving power of a driver in an internal input/output terminal or an internal output terminal, which is used for exchanging a signal with another semiconductor integrated circuit in the multi-chip package. It offers an advantage of being able to optimize the driving power after packaging, thereby suppressing the noise and power consumption.

According to a second aspect of the present invention, there is provided a multi-chip package including driving power variably setting means for variably setting driving power of a driver in an internal input/output terminal or an internal output terminal, which is used for exchanging a signal with another semiconductor integrated circuit in the multi-chip package, a driving power control pad for transferring a control signal to the driving power variably setting means; and an external terminal for transferring the input control signal to the driving power control pad. It offers an advantage of being able to optimize the driving power after packaging by supplying the control signal via the external terminal.

DETAILED DESCRIPTION OF THE PREFERRED EMBODIMENTS

The invention will now be described with reference to the accompanying drawings.

Embodiment 1

Figure 1:
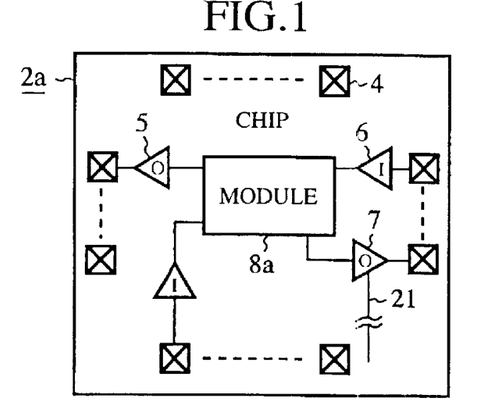
FIG. 1 is a diagram showing a configuration of a semiconductor integrated circuit used for a multi-chip package of an embodiment 1 in accordance with the present invention.

FIG. 1 is a diagram showing a configuration of a semiconductor integrated circuit used for a multi-chip package of an embodiment 1 in accordance with the present invention. In this figure, the reference numeral 2a designates a chip (semiconductor integrated circuit).

In the chip 2a, each reference numeral 4 designates a pad; the reference numeral 5 designates an external output driver for outputting an internal signal to the outside of the multi-chip package (abbreviated to MCP from now on); 6 designates an internal input driver for inputting a signal from another chip within the MCP; 7 designates an internal output driver for outputting an internal signal to another chip within the MCP; 8a designates a module; and 21 designates a control signal for variably setting the driving power of the internal output driver 7.

In FIG. 1, a pad 4 coupled to an external output driver 5 constitutes an external output terminal, a pad 4 coupled to an internal input driver 6 constitutes an internal input terminal, and a pad 4 coupled to an internal output driver 7 constitutes an internal output terminal. In addition, although not shown in FIG. 1, there is an external input/output driver for inputting a signal from the outside of the MCP and for outputting an internal signal to the outside of the MCP. A pad 4 coupled to an external input/output driver constitutes an external input/output terminal. Furthermore, there is an internal input/output driver for inputting a signal from another chip within the MCP and for outputting an internal signal to another chip within the MCP. A pad 4 coupled to an internal input/output driver constitutes an internal input/output terminal.

Figure 2A:
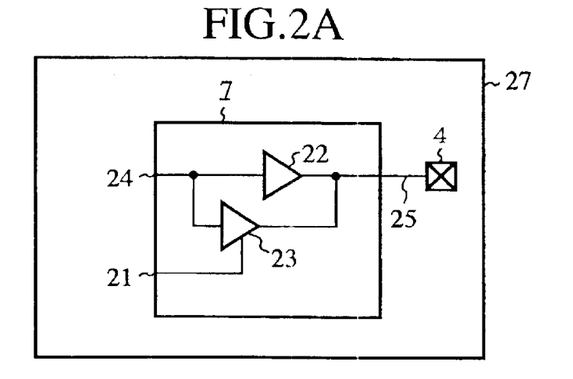
FIG. 2A is a diagram showing a detailed configuration of an internal output terminal.

FIG. 2A is a diagram showing a detailed configuration of the internal output terminal 27. The internal output terminal 27 comprises the internal output driver 7 and a pad 4. The internal output driver 7 comprises a normally used driver 22 and a power adjusting driver 23, both of which are supplied with an internal signal 24, and the power adjusting driver 23 is supplied with a control signal 21. The output signal 25 of the internal output driver 7 is delivered outside via the pad 4.

Figure 2B:
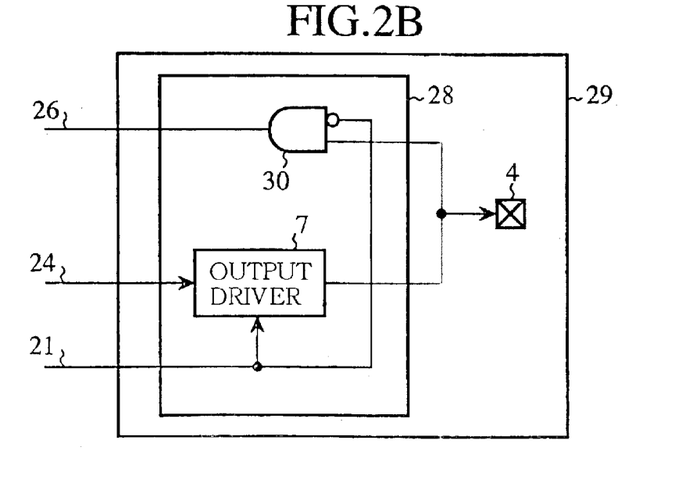
FIG. 2B is a diagram showing a detailed configuration of an internal input/output terminal.

FIG. 2B is a diagram showing a detailed configuration of the internal input/output terminal 29. It consists of an internal input/output driver 28 and pad 4, and the internal input/output driver 28 consists of the internal output driver 7 and an AND gate 30. The AND gate 30 outputs an input signal 26.

Figure 3:
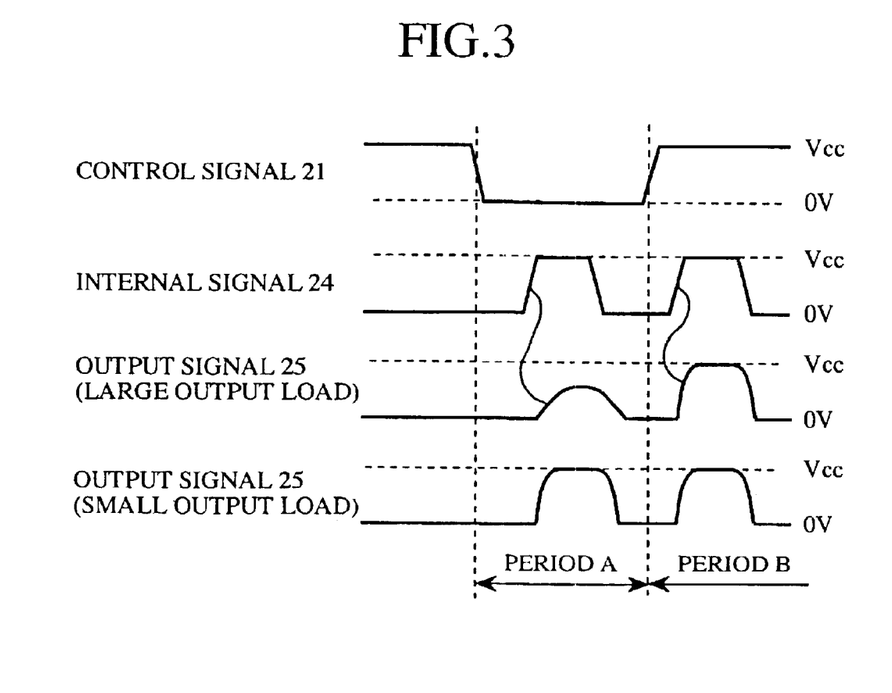
FIG. 3 is a waveform chart illustrating waveforms of an output signal corresponding to a control signal.

FIG. 3 is a waveform chart illustrating waveforms of an output signal corresponding to a control signal.

Next, the operation of the present embodiment 1 will be described.

The present embodiment 1 as shown in FIG. 1 is configured such that the control signal 21 variably sets the driving power of the internal output driver 7.

FIG. 2A shows the details of the internal output driver 7. It comprises the normally used driver 22 and power adjusting driver 23 connected in parallel. The parallel connection is supplied with the internal signal 24, and outputs the output signal 25. The power adjusting driver 23 is controlled by the control signal 21 such that its driving power undergoes on/off control.

For example, assume that the power adjusting driver 23 has the driving power equal to that of the normally used driver 22, and that the driving power of the power adjusting driver 23 is turned on by the "H" level control signal 21. When it is turned on, both the normally used driver 22 and power adjusting driver 23 drive the load on the output side simultaneously. In contrast, when the "L" level control signal 21 turns off the driving power of the power adjusting driver 23, only the normally used driver 22 drives the load on the output side.

Since they can secure sufficient driving power of the load capacitance between the tester and the internal input/output terminal or internal output terminal in the former case, they can solve the above-mentioned problem in the individual wafer test, thereby enabling a stable test.

In addition, since it is not necessary to drive large load capacitance after packaging, the latter setting is enough. That is, only the normally used driver 22 is used for driving the external load with the power adjusting driver 23 being used as an off transistor. Thus, the present embodiment 1 can prevent the noise and power consumption from being increased.

In the waveform chart of FIG. 3, while the control signal 21 is at "L" level, the power adjusting driver 23 is turned off so that only the normally used driver 22 drives the load on the output side. In this case, if the load on the output side is a large load such as that connected at the individual wafer test, the waveform of the output signal 25 cannot rise up to the power supply level Vcc. In contrast, if the load on the output side is a small load such as that after packaging, the waveform of the output signal 25 can rise up to the power supply level Vcc, and suppress the noise and power consumption in that case.

On the other hand, while the control signal 21 is at the "H" level, the power adjusting driver 23 is turned on so that both the normally used driver 22 and the power adjusting driver 23 drive the load on the output side. In this case, even if the load on the output side is a large load such as that connected at the individual wafer test, the waveform of the output signal 25 can rise up to the power supply level Vcc. In addition, if the load on the output side is a small load such as that after packaging, although the waveform of the output signal 25 can rise up to the power supply level Vcc, it is inevitable that the noise and power consumption will increase in this case.

As described above, the present embodiment 1 is configured such that it can variably set the driving power of all or part of the internal input/output terminals and internal output terminals, which are used only within the MCP. Thus, it can sufficiently drive the large load connected between the tester and the internal input/output terminal or internal output terminal by increasing the driving power during the individual wafer test before packaging. In addition, it can suppress the noise or power consumption by reducing the driving power after packaging.

Embodiment 2

Figure 4:
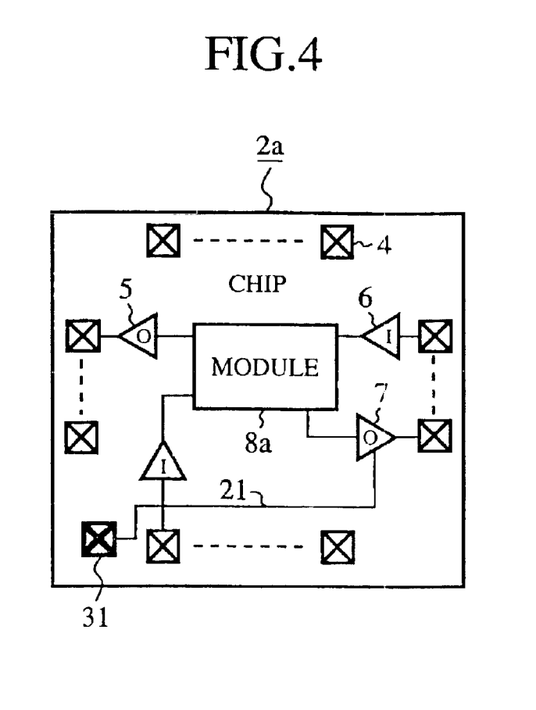
FIG. 4 is a diagram showing a configuration of a semiconductor integrated circuit used for a multi-chip package of an embodiment 2 in accordance with the present invention.

FIG. 4 is a diagram showing a configuration of a semiconductor integrated circuit used for a multi-chip package of an embodiment 2 in accordance with the present invention. In this figure, the reference numeral 31 designates a driving power control pad through which the control signal 21 is input. The remaining configuration is the same as that of FIG. 1.

Figure 5:
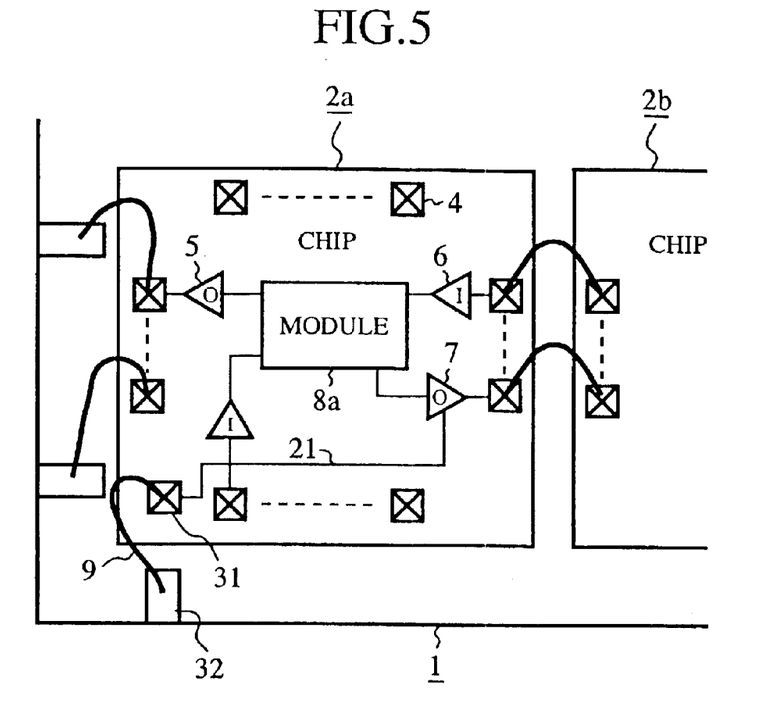
FIG. 5 is a diagram showing a configuration of a multi-chip package on which the semiconductor integrated circuit is mounted.

FIG. 5 is a diagram showing a configuration of a multi-chip package on which the semiconductor integrated circuit as shown in FIG. 4 mounted. In this figure, the reference numeral 1 designates a multi-chip package, 2b designates another chip (semiconductor integrated circuit), and 32 designates an external terminal connected to the driving power control pad 31 by the wire 9, for transmitting the input control signal 21 to the driving power control pad 31.

Figure 6:
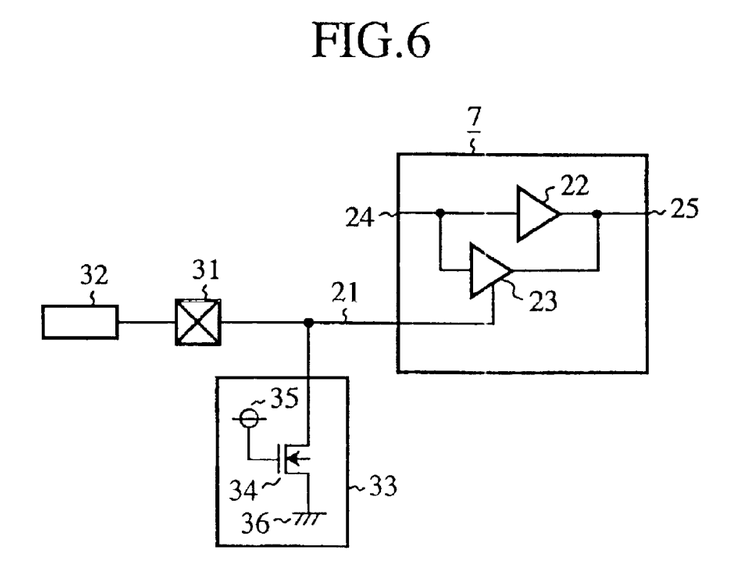
FIG. 6 is a block diagram showing a detailed configuration from an external terminal 32 to an internal output driver 7.

FIG. 6 is a block diagram showing a detailed configuration from the external terminal 32 to the internal output driver 7. In this figure, the reference numeral 32 designates the external terminal, 31 designates the driving power control pad, 33 designates a pull-down transistor, 34 designates an N-channel transistor, 35 designates a power supply Vcc, and 36 designates a ground. The reference numeral 7 designates the internal output driver.

Next, the operation of the present embodiment 2 will be described.

As shown in FIG. 4, the present embodiment 2 comprises the driving power control pad 31 for inputting the control signal 21 to the chip 2a used by the MCP.

Thus, the present embodiment 2 can supply the control signal to the driving power control pad 31 directly, thereby enabling the driving power to be variably set easily.

The configuration of FIG. 5 provides the MCP 1 with the external terminal 32 for transferring the control signal 21 to the driving power control pad 31.

Accordingly, it can readily optimize the driving power by supplying the control signal via the external terminal 32 even after packaging.

FIG. 6 is a block diagram showing a detailed configuration from the external terminal 32 to the internal output driver 7.

During the individual wafer test, the driving power control pad 31 is supplied with the "H" level control signal 21 so that the driving power of the power adjusting driver 23 is turned on. Thus, both the normally used driver 22 and power adjusting driver 23 drive the load on the output side by their driving power.

Other than the time of the individual wafer test such as after packaging, the external terminal 32 is supplied with the "L" level control signal 21 so that the driving power of the power adjusting driver 23 is turned off via the driving power control pad 31. Thus, only the normally used driver 22 drives the load on the output side by its own driving power.

The pull-down transistor 33 includes the N-channel transistor 34 which is brought into conduction by the power supply Vcc 35, even when the driving power control pad 31 is not supplied with the "L" level control signal 21 during the time other than the individual wafer test. Thus, the power adjusting driver 23 is supplied with the "L" level by the ground 36 in this case. Therefore, it is enough for the driving power control pad 31 to be supplied with the "H" level control signal 21 only during the individual wafer test.

As described above, the present embodiment 2 is configured such that the chip 2a comprises the driving power control pad 31 which is supplied with the control signal 21, or that the MCP 1 comprises the external terminal 32 which is connected to the driving power control pad 31. Thus, the present embodiment 2 can variably set the driving power easily by supplying the control signal 21 to the driving power control pad 31, or optimize the driving power at ease by supplying the control signal 21 via the external terminal 32 even after packaging.

Embodiment 3

Figure 7:
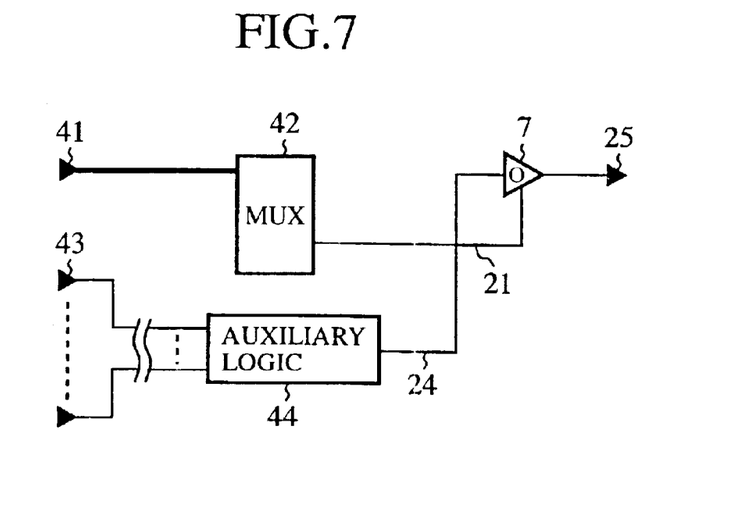
FIG. 7 is a block diagram showing a configuration of a control signal generating circuit of an embodiment 3 in accordance with the present invention.

FIG. 7 is a block diagram showing a configuration of a control signal generating circuit of an embodiment 3 in accordance with the present invention. In this figure, the reference numeral 41 designates a test signal that is input from the outside; 42 designates a multiplexer for generating the control signal 21 in response to the test signal 41 to variably set the driving power of the internal output driver 7; 43 designates other input signals; and 44 designates an auxiliary logic for processing the other input signals 43, and for supplying them to the internal output driver 7 as an internal signal 24.

Figure 8:
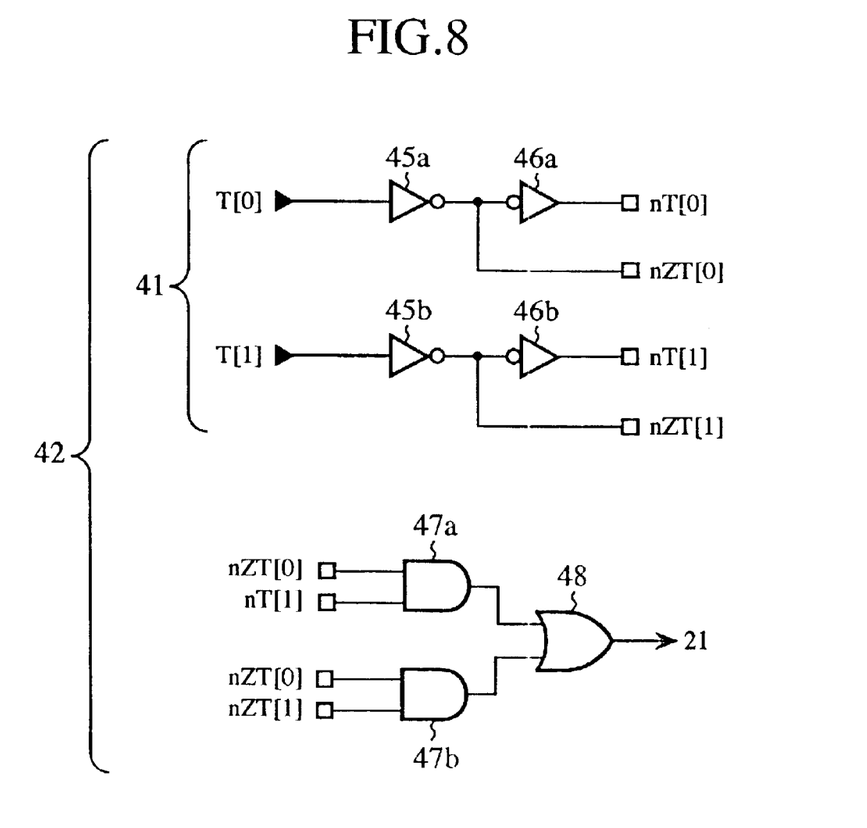
FIG. 8 is a circuit diagram showing a detailed configuration of the multiplexer of FIG. 7.

FIG. 8 is a circuit diagram showing a detailed configuration of the multiplexer 42. In this figure, the reference numerals 45a and 45b each designate an inverter, 46a and 46b each designate an inverter, 47a and 47b each designate an AND gate, and the reference numeral 48 designates an OR gate.

Next, the operation of the present embodiment 3 will be described.

The present embodiment 3 as shown in FIG. 7 is configured such that the multiplexer 42 generates the control signal 21 in response to the test signal 41 supplied via the pads 4 of the chip 2a or the external terminals 3 of the MCP 1, thereby variably setting the driving power of the internal output driver 7.

FIG. 8 shows a detailed configuration of the multiplexer 42. It outputs the "H" level control signal 21 only when the input test signal 41 T[0:1] is {T[0]=L, T[1]=L}, and {T[0]=L, T[1]=H}.

As described above, the present embodiment 3 generates the control signal 21 in response to the test signal 41 supplied from the outside. Accordingly, it can readily optimize the driving power without the dedicated driving power control pad 31 or external terminal 32 used for variably setting the driving power.

Embodiment 4

Figure 9:
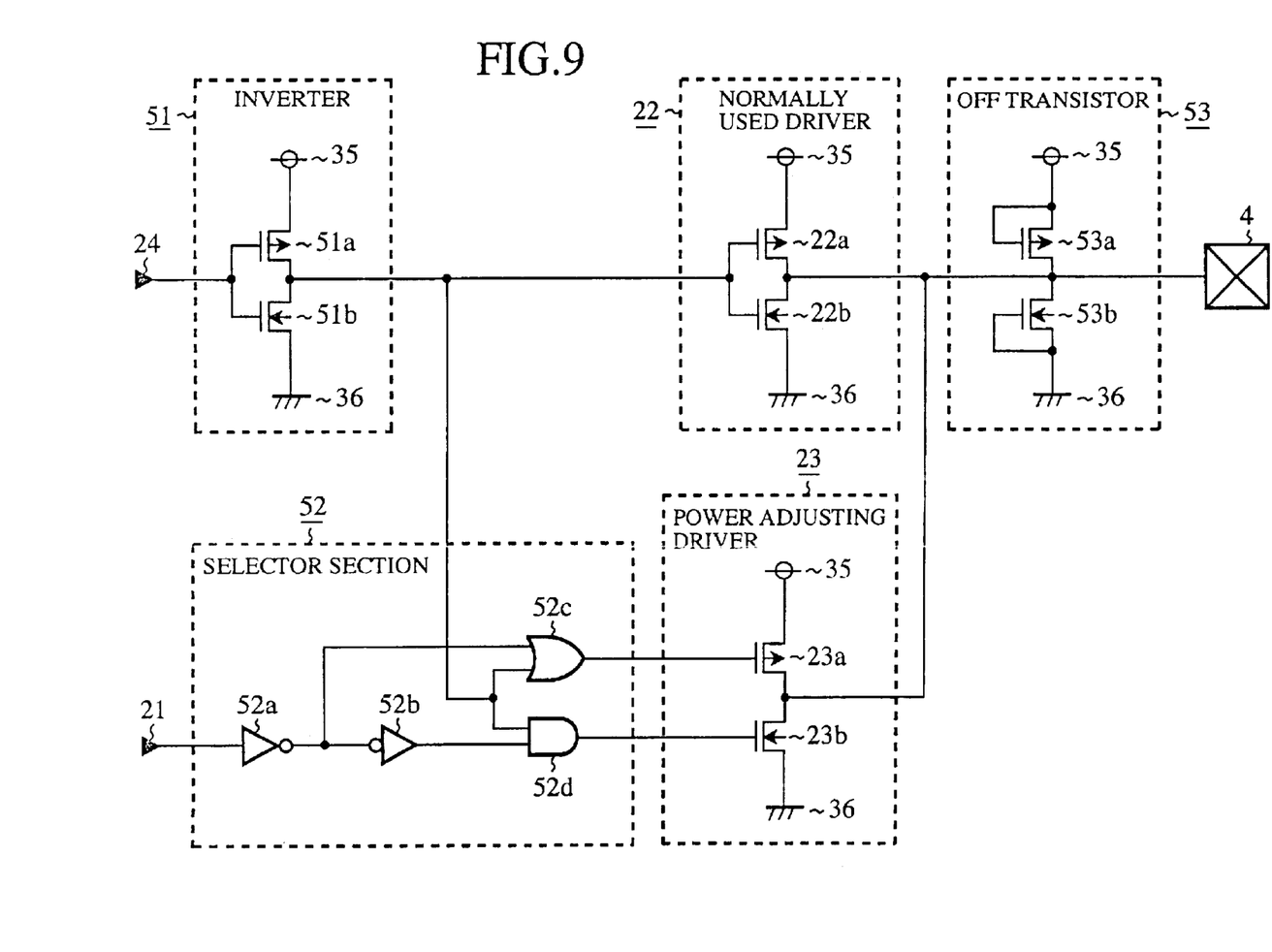
FIG. 9 is a circuit diagram showing a detailed configuration of an internal output driver based on a selector system of an embodiment 4 in accordance with the present invention.

FIG. 9 is a circuit diagram showing a detailed configuration of an internal output driver based on a selector system of an embodiment 4 in accordance with the present invention. In this figure, the reference numeral 51 designates an inverter for inverting the internal signal 24; 35 designates a power supply Vcc, 36 designates a ground, 51a designates a P-channel transistor, and 51b designates an N-channel transistor.

The reference numeral 52 designates a selector section for enabling the power adjusting driver 23 in response to the control signal 21; reference numerals 52a and 52b each designate an inverter; the reference numeral 52c designates an OR gate; and 52d designates an AND gate.

The normally used driver 22 comprises a P-channel transistor 22a, and an N-channel transistor 22b.

The power adjusting driver 23 comprises a P-channel transistor 23a and an N-channel transistor 23b.

The reference numeral 53 designates an off transistor comprising a P-channel transistor 53a and an N-channel transistor 53b.

Next, the operation of the present embodiment 4 will be described.

The inverter 51 inverts the internal signal 24 and outputs it. The normally used driver 22 further inverts the inverted internal signal 24, and supplies it to the pad 4 via the off transistor 53. The off transistor 53 is provided as anti-surge measures.

When supplied with the "H" level control signal 21, the selector section 52 supplies the internal signal 24 passing through the inverter 51 to the gates of the P-channel transistor 23a and N-channel transistor 23b of the power adjusting driver 23 through the OR gate 52c and AND gate 52d, thereby enabling the power adjusting driver 23 to operate as an internal output driver.

On the other hand, when supplied with the "L" level control signal 21, the selector section 52 supplies the gates of the P-channel transistor 23a and N-channel transistor 23b of the power adjusting driver 23 with "H" level through the OR gate 52c and "L" level through the AND gate 52d, respectively, regardless of the internal signal 24 passing through the inverter 51. Thus, the present embodiment 4 can make the power adjusting driver 23 an off transistor, which is effective as anti-surge measures.

As described above, the present embodiment 4 is configured such that the selector section 52 enables the power adjusting driver 23 in response to the control signal 21. Thus, it can variably set the driving power of the internal output driver.

In addition, the selector section 52 can use the power adjusting driver 23 as an off transistor during the time other than the individual wafer test, which is an effective anti-surge measure.

Although the single control signal 21 and power adjusting driver 23 are provided in the present embodiment 4, this is not essential. A plurality of control signals 21 and power adjusting drivers 23 can be provided to more finely adjust the driving power stepwise.

Embodiment 5

Figure 10:
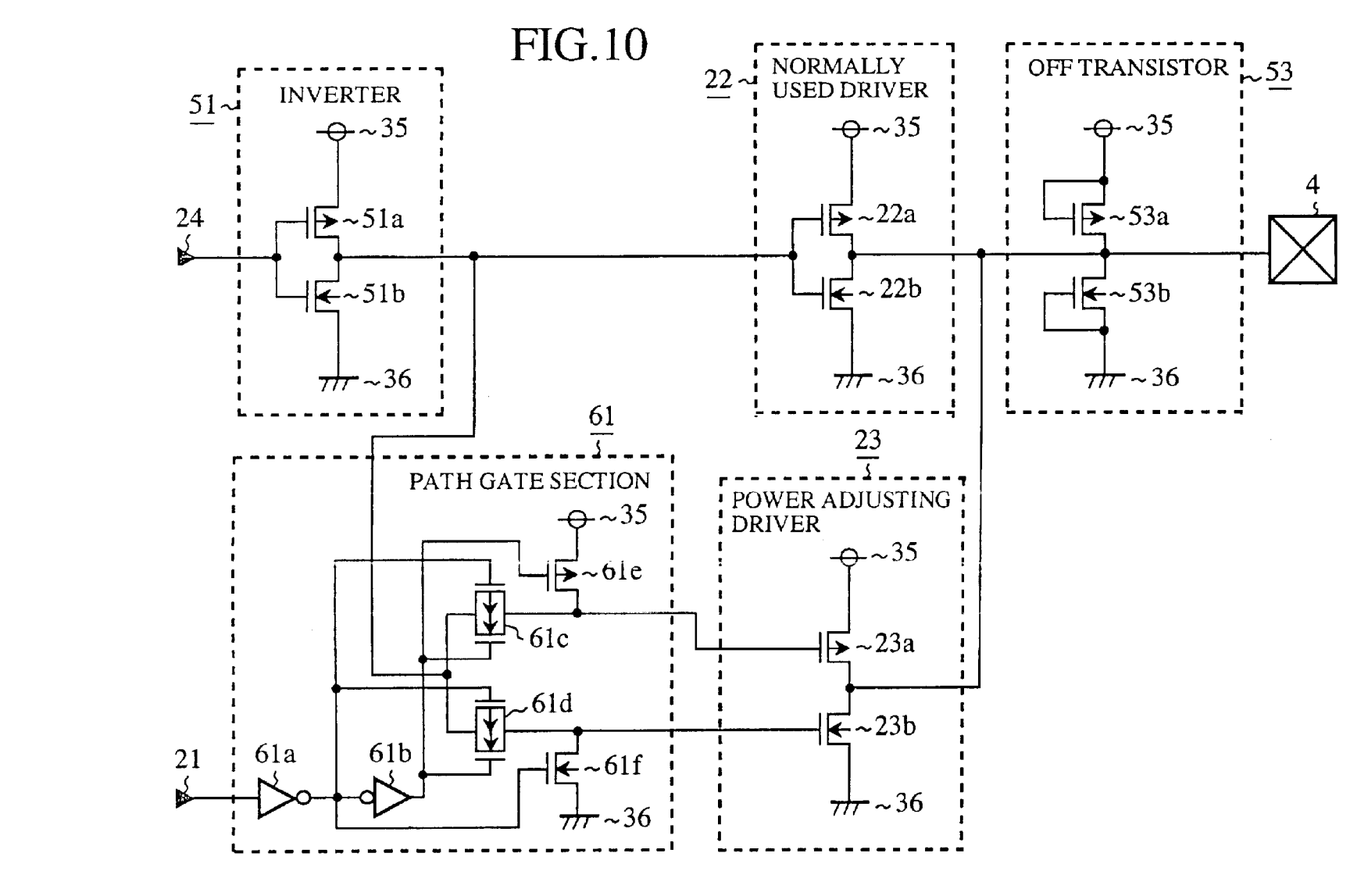
FIG. 10 is a circuit diagram showing a detailed configuration of an internal output driver based on a path gate system of an embodiment 5 in accordance with the present invention.

FIG. 10 is a circuit diagram showing a detailed configuration of an internal output driver based on a path gate system of an embodiment 5 in accordance with the present invention. In this figure, the reference numeral 61 designates a path gate section for enabling the power adjusting driver 23 in response to the control signal 21; reference numerals 61a and 61b each designate an inverter; 61c and 61d each designate a transmission gate; the reference numeral 61e designates a P-channel transistor; and 61f designates an N-channel transistor.

The remaining configuration is the same as that of FIG. 9.

Next, the operation of the present embodiment 5 will be described.

When supplied with the "H" level control signal 21, the path gate section 61 turns off the P-channel transistor 61e by the "H" level output of the inverter 61b, and the N-channel transistor 61f by the "L" level output of the inverter 61a. In addition, the transmission gates 61c and 61d are both turned on by the "H" level output of the inverter 61b and the "L" level output of the inverter 61a. Thus, the internal signal 24 passing through the inverter 51 is supplied to the gates of the P-channel transistor 23a and N-channel transistor 23b of the power adjusting driver 23, thereby enabling the power adjusting driver 23 to operate as the internal output driver.

In contrast, when supplied with the "L" level control signal 21, the path gate section 61 turns on the P-channel transistor 61e by the "L" level output of the inverter 61b, and the N-channel transistor 61f by the "H" level output of the inverter 61a. In addition, the transmission gates 61c and 61d are both turned off by the "L" level output of the inverter 61b and the "H" level output of the inverter 61a. Thus, the power adjusting driver 23 is made an off transistor, which is an effective anti-surge measure.

As described above, the present embodiment 5 is configured such that the path gate section 61 enables the power adjusting driver 23 in response to the control signal 21. Thus, it can variably set the driving power of the internal output driver.

In addition, the path gate section 61 can set the power adjusting driver 23 as an off transistor during the time other than the individual wafer test, which is an effective anti-surge measure.

Although the single control signal 21 and power adjusting driver 23 are provided in the present embodiment 5, this is not essential. A plurality of control signals 21 and power adjusting drivers 23 can be provided to more finely adjust the driving power stepwise.

Embodiment 6

Figure 11:
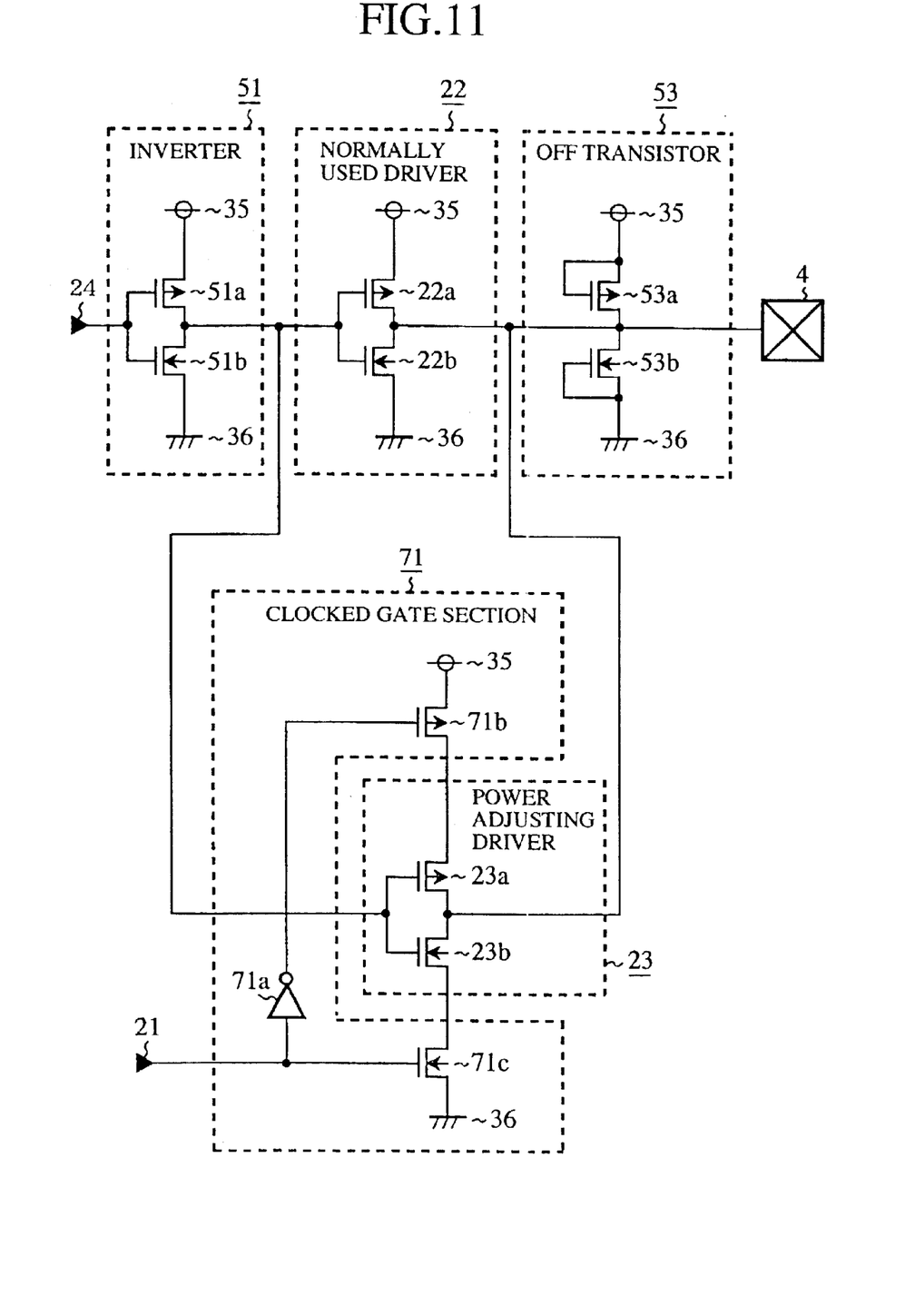
FIG. 11 is a circuit diagram showing a detailed configuration of an internal output driver based on a clocked gate system of an embodiment 6 in accordance with the present invention.

FIG. 11 is a circuit diagram showing a detailed configuration of an internal output driver based on a clocked gate system of an embodiment 6 in accordance with the present invention. In this figure, the reference numeral 71 designates a clocked gate section for enabling the power adjusting driver 23 in response to the control signal 21; 71a designates an inverter, 71b designates a P-channel transistor, and 71c designates an N-channel transistor.

The remaining configuration is the same as that of FIG. 10.

Next, the operation of the present embodiment 6 will be described.

When supplied with the "H" level control signal 21, the clocked gate section 71 turns on the N-channel transistor 71c by the "H" level control signal 21, and the P-channel transistor 71b by the "L" level output of the inverter 71a. Thus, the present embodiment 6 can operate the power adjusting driver 23 as an internal output driver.

In contrast, when supplied with the "L" level control signal 21, the clocked gate section 71 turns off the N-channel transistor 71c by the "L" level control signal 21, and the P-channel transistor 71b by the "H" level output of the inverter 71a. Thus, the present embodiment 6 can make the power adjusting driver 23 an off transistor, which is effective as the anti-surge measures.

As described above, the present embodiment 6 is configured such that the clocked gate section 71 enables the power adjusting driver 23 in response to the control signal 21. Thus, it can variably set the driving power of the internal output driver.

In addition, the clocked gate section 71 enables the power adjusting driver 23 to be used as an off transistor during the time other than the individual wafer test, which is effective as the anti-surge measures.

Although the single control signal 21 and power adjusting driver 23 are provided in the present embodiment 6, this is not essential. A plurality of control signals 21 and power adjusting drivers 23 can be provided to more finely adjust the driving power stepwise.

What is claimed is:

1. A semiconductor integrated circuit used for a multi-chip package including a plurality of semiconductor integrated circuits, said semiconductor integrated circuit comprising:

at least one internal output terminal, each of which includes a driver and is used for exchanging a signal with another semiconductor integrated circuit in said multi-chip package; and driving power variably setting means for variably setting driving power of the driver.

2. The semiconductor integrated circuit according to claim 1, wherein said driving power variably setting means sets the driving power of said at least one internal output terminal at a value less than a predetermined value, after packaging said semiconductor integrated circuit into said multi-chip package.

3. The semiconductor integrated circuit according to claim 1, wherein said driving power variably setting means sets the driving power of said at least one internal output terminal at a value greater than a predetermined value, during an individual wafer test before packaging said semiconductor integrated circuit into said multi-chip package.

4. The semiconductor integrated circuit according to claim 1, wherein said driving power variably setting means comprises a driving power control pad for inputting a control signal.

5. The semiconductor integrated circuit according to claim 1, wherein said driving power variably setting means comprises a control signal generating circuit for generating a control signal in response to a test signal supplied from an outside, and carries out the variable setting of the driving power of said at least one internal output terminal.

6. The semiconductor integrated circuit according to claim 1, wherein said at least one internal output terminal comprises a normally used driver, a power adjusting driver, and a selector section for enabling said power adjusting driver in response to a control signal.

7. The semiconductor integrated circuit according to claim 1, wherein said at least one internal output terminal comprises a normally used driver, a power adjusting driver, and a path gate section for enabling said power adjusting driver in response to a control signal.

8. The semiconductor integrated circuit according to claim 1, wherein said at least one internal output terminal comprises a normally used driver, a power adjusting driver, and a clocked gate section for enabling said power adjusting driver in response to a control signal.

9. The semiconductor integrated circuit according to claim 6, wherein said selector section makes'said power adjusting driver an off transistor in response to the control signal at a time other than during an individual wafer test.

10. The semiconductor integrated circuit according to claim 7, wherein said path gate section makes said power adjusting driver an off transistor in response to the control signal at a time other than during an individual wafer test.

11. The semiconductor integrated circuit according to claim 8, wherein said clocked gate section makes said power adjusting driver an off transistor in response to the control signal at a time other than during an individual wafer test.

12. A multi-chip package including a plurality of semiconductor integrated circuits, at least one of said plurality of semiconductor integrated circuits comprising:

at least one internal output terminal, each of which includes a driver and is used for exchanging a signal with another semiconductor integrated circuit in said multi-chip package;

driving power variably setting means for variably setting driving power of the driver;

a driving power control pad for transferring a control signal to said driving power variably setting means; and an external terminal connected to said driving power control pad and for transferring the input control signal to said driving power control pad.

* * * * *